(12) United States Patent
Rangarajan et al.

(10) Patent No.: US 6,593,210 B1
(45) Date of Patent: Jul. 15, 2003

(54) SELF-ALIGNED/MASKLESS REVERSE ETCH PROCESS USING AN INORGANIC FILM

(75) Inventors: Bharath Rangarajan, Santa Clara, CA (US); Bhanwar Singh, Morgan Hill, CA (US); Ursula Q. Quinto, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 42 days.

(21) Appl. No.: 09/707,214

(22) Filed: Nov. 6, 2000

Related U.S. Application Data

(60) Provisional application No. 60/242,758, filed on Oct. 24, 2000.

(51) Int. Cl.$^7$ ................................................ H01L 21/76
(52) U.S. Cl. ...................... 438/437; 438/424; 438/427; 438/435
(58) Field of Search ................................. 438/437, 435, 438/427, 424

(56) References Cited

U.S. PATENT DOCUMENTS

| | | | | |
|---|---|---|---|---|
| 4,576,834 A | | 3/1986 | Sobczak | 427/93 |
| 4,654,120 A | * | 3/1987 | Dougherty | |
| 4,962,064 A | * | 10/1990 | Haskell et al. | |
| 5,362,669 A | * | 11/1994 | Boyd et al. | |
| 5,382,541 A | * | 1/1995 | Bajor et al. | |
| 5,459,096 A | * | 10/1995 | Venkatesan et al. | |
| 5,652,176 A | | 7/1997 | Maniar et al. | 437/67 |
| 5,702,977 A | | 12/1997 | Jang et al. | 437/67 |
| 6,008,109 A | | 12/1999 | Fulford, Jr. et al. | 438/437 |
| 6,057,211 A | | 5/2000 | Schwalke | 438/428 |
| 6,064,104 A | | 5/2000 | Omid-Zohoor et al. | 257/510 |
| 6,069,067 A | | 5/2000 | Kinugawa | 438/622 |
| 6,071,792 A | * | 6/2000 | Kim et al. | |
| 6,096,622 A | * | 8/2000 | Kim et al. | |
| 6,110,801 A | * | 8/2000 | Tsai et al. | |
| 6,114,220 A | * | 9/2000 | Tsai et al. | |
| 6,146,975 A | * | 11/2000 | Kuchme et al. | |
| 6,191,003 B1 | * | 2/2001 | Lin et al. | |
| 6,197,660 B1 | * | 3/2001 | Jang et al. | |
| 6,218,267 B1 | * | 4/2001 | Liu | |
| 6,242,323 B1 | * | 6/2001 | Ishisuka et al. | |
| 6,245,642 B1 | * | 6/2001 | Satoh | |
| 6,291,111 B1 | * | 9/2001 | Chen et al. | |
| 6,323,533 B1 | * | 11/2001 | Van Der Zaag et al. | |

* cited by examiner

Primary Examiner—Long Pham
(74) Attorney, Agent, or Firm—Amin & Turocy, LLP

(57) ABSTRACT

One aspect of the present invention relates to a method of forming trench isolation regions within a semiconductor substrate, involving the steps of forming trenches in the semiconductor substrate; depositing a semi-conformal dielectric material over the substrate, wherein the semi-conformal dielectric material has valleys positioned over the trenches; forming an inorganic conformal film over the semi-conformal dielectric material; polishing the semiconductor substrate whereby a first portion of the inorganic conformal film is removed thereby exposing a portion of the semi-conformal dielectric material, and a second portion remains over the valleys of the semi-conformal dielectric material; removing the exposed portions of the semi-conformal dielectric material; and planarizing the substrate to provide the semiconductor substrate having trenches with a dielectric material therein.

20 Claims, 10 Drawing Sheets

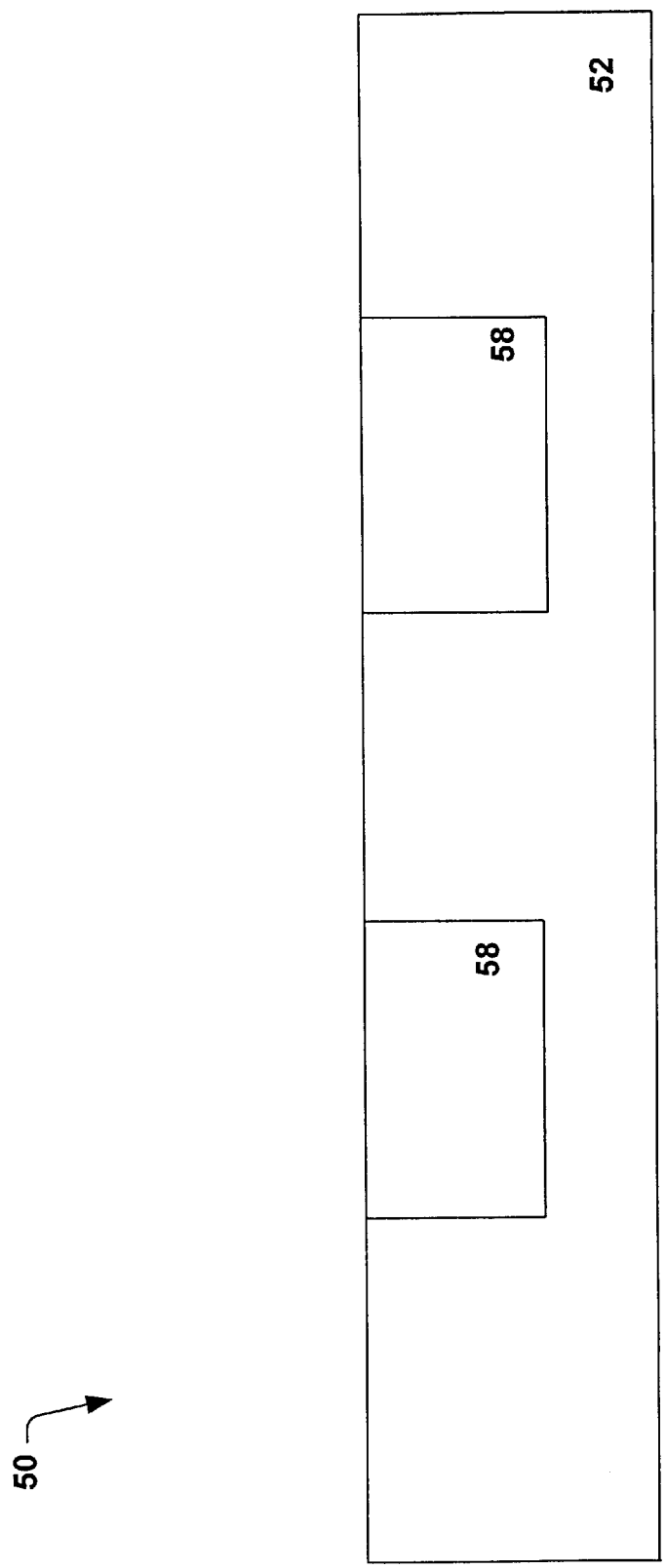

SELF-ALIGNED/MASKLESS REVERSE ETCH PROCESS USING AN INORGANIC FILM

This application claims domestic priority to provisional application Ser. No. 60/242,758 filed Oct. 24, 2000.

TECHNICAL FIELD

The present invention generally relates to processing a semiconductor substrate. In particular, the present invention relates to a maskless method of forming insulation regions within a substrate.

BACKGROUND ART

In the semiconductor industry, there is a continuing trend toward higher device densities. Fabrication of very large scale integrated circuits (VLSI) and ultra large scale integrated circuits (ULSI) requires that resist materials, lithographic processes, and exposure tools meet necessary performance demands for high throughput manufacturing of sub-micron feature size devices. In particular, the semiconductor industry is producing with increasing frequency integrated circuits having structures which are markedly less than 1 µm. The increased integration density increases the requirements imposed on the photolithographic process.

Integrated circuits typically contain a plurality of conductive lines, such as bus lines, bit lines, word lines, and logic interconnect lines and a plurality of electrical devices, such as MOSFETS, on a semiconductor substrate. The conductive lines and electric devices are typically separated from each other by insulation regions/materials. The spacing of interconnection lines and electrical devices generally constitutes a limiting factor in terms of integration and various functional characteristics of the integrated circuit. Consequently, reliable and cost effective methods of providing the insulation regions/materials are desired. In this connection, it is common to employ isolation technologies such as using shallow trench isolation, LOCOS (LOCal Oxidation of Silicon), and recessed oxide isolation to form isolation regions.

One conventional method for providing insulation regions/materials, such as trench filling and active site isolation, includes the utilization of a mask or photoresist layer. FIGS. 1–3 illustrate this conventional method.

Referring to FIG. 1, a semiconductor structure 10 is shown with a substrate 12 having a plurality of active regions 20 and a plurality of trenches 14 therein. The trenches 14 therein define the active regions 20 of the substrate 12. An insulation material 16 is deposited over the substrate 12. A photoresist 18 is patterned on the semiconductor structure 10 so that the patterned photoresist 18 is positioned over the trenches 14 leaving the portion of the insulation material 16 over the active regions 20 exposed.

Referring to FIG. 2, the insulation material 16 exposed (over the active regions 20) is removed from the semiconductor structure 10 using any suitable technique, such as an anisotropic etching technique. The insulation material 16 is removed down to a level approximately equivalent to the upper surface of the semiconductor substrate 12.

Referring to FIG. 3, the patterned photoresist 18 is removed from the semiconductor structure 10 by use of any suitable method, such as wet chemical etching or plasma ashing, leaving a portion of the insulation material 16 in the trenches 14. The surface of the semiconductor structure 10 is then planarized by any suitable method, such as using CMP techniques (chemical-mechanical polishing), so that the upper surface of the active regions 20 of the semiconductor substrate 12 and the insulation material 16 formed inside the trenches 14 are substantially co-planar.

While the above-described trench isolation method is commonly employed in the art of advanced integrated circuit fabrication, such a method is not entirely without problems. In particular, there is a concern in ensuring that the photoresist is properly patterned so that the patterned photoresist only and accurately covers the insulation material located within the trenches. Because it is difficult to align the patterned photoresist directly above the trenches, there may be an insufficient amount of photoresist above the trenches to provide trench protection during a subsequent etching process. This can lead to the undesirable removal of the insulation material located within the trenches during a subsequent etching process. In particular, an improperly positioned patterned photoresist may result in the formation of voids within the trenches, and more notably between the insulation material inside the trenches and the active regions.

The desire to build faster and more complex integrated circuits means that the semiconductor industry devotes much effort to reducing the feature sizes of and the separation between conductive features, electrical devices, and active regions on a semiconductor substrate. The risk of void formation increases as semiconductor devices are made increasingly narrower with widths on the submicron level.

The use of a photoresist raises additional concerns, such as the potentially cumbersome steps associated with depositing, using and removing it. In other words, there are numerous potentially cumbersome processing steps associated with depositing the photoresist, irradiating the photoresist, developing the photoresist, stripping the photoresist, and cleaning the semiconductor structure. Any errors or inadequacies associated with any of the photoresist processing steps may potentially render useless the subsequent processing of semiconductor structure.

SUMMARY OF THE INVENTION

The present invention provides an alternative method of forming isolation regions within a substrate. The methods of the present invention do not require the use of photolithography/photoresists to fill the trenches of a substrate with a dielectric material. By eliminating the use of photolithography/photoresists to fill the trenches of a substrate, any concerns and/or problems associated with photolithography and photoresists are thereby eliminated. In particular, alignment of a masking layer over the trenches of a substrate is accurate and reliable when formed in accordance with the present invention.

One aspect of the present invention relates to a method of forming trench isolation regions within a semiconductor substrate, involving the steps of forming trenches in the semiconductor substrate; depositing a semi-conformal dielectric material over the substrate, wherein the semi-conformal dielectric material has valleys positioned over the trenches; forming an inorganic conformal film over the semi-conformal dielectric material; polishing the semiconductor substrate whereby a first portion of the inorganic conformal film is removed thereby exposing a portion of the semi-conformal dielectric material, and a second portion remains over the valleys of the semi-conformal dielectric material; removing the exposed portions of the semi-conformal dielectric material; and planarizing the substrate to provide the semiconductor substrate having trenches with a dielectric material therein.

Another aspect of the present invention relates to a method of forming trench isolation regions within a semiconductor substrate, involving the steps of providing the semiconductor substrate having trenches therein and active regions; depositing a semi-conformal dielectric material over the substrate, wherein the semi-conformal dielectric material has valleys positioned over the trenches and peaks positioned over the active regions; forming an inorganic conformal film over the semi-conformal dielectric material; polishing the semiconductor substrate whereby portions of the inorganic conformal film over the active regions are removed thereby exposing a portion of the semi-conformal dielectric material, and portions of the inorganic conformal film over the valleys of the semi-conformal dielectric material remain; removing the exposed portions of the semi-conformal dielectric material; and planarizing the substrate to provide the semiconductor substrate having trenches with a dielectric material therein.

BRIEF DESCRIPTION OF DRAWINGS

FIG. 9 illustrates a cross-sectional view of a substrate produced in accordance with one aspect of the present invention.

DISCLOSURE OF INVENTION

The present invention involves forming insulation regions without using a photoresist. The methods of the present invention provide high fidelity insulation regions substantially without any defects. Misalignment errors associated with using photoresists are therefore eliminated by the present invention.

The present invention is next described in connection with FIGS. 4–9, wherein like numerals are used to represent like features throughout. FIGS. 4–9 illustrate examples of a method in connection with forming isolation regions that electrically isolate active regions, metal structures such as conductive lines, and electrical devices within a semiconductor structure 50. Active regions, metal structures, and electrical devices include various device structures, active elements and passive elements including polysilicon gates, wordlines, source regions, drain regions, bit lines, bases, emitters, collectors, conductive lines, conductive plugs, diffusion regions, etc. The method of FIGS. 4–9 may be used with any suitable semiconductor technology including but not limited to NMOS, PMOS, CMOS, BiCMOS, bipolar, multi-chip modules (MCM) and III–IV semiconductors.

Figure 1:
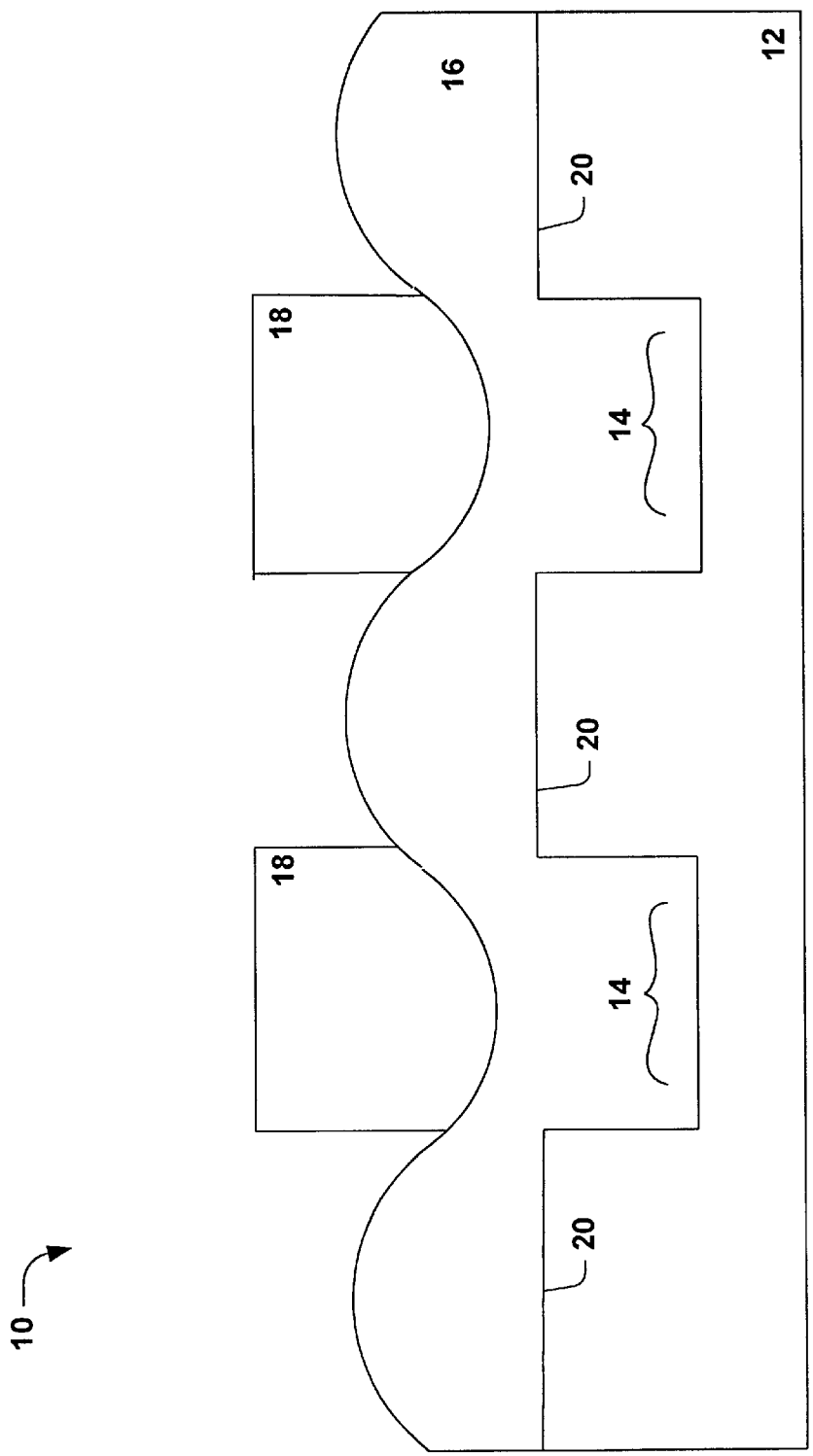
FIG. 1 illustrates a cross-sectional view of one aspect of a conventional trench isolation method.
Figure 2:
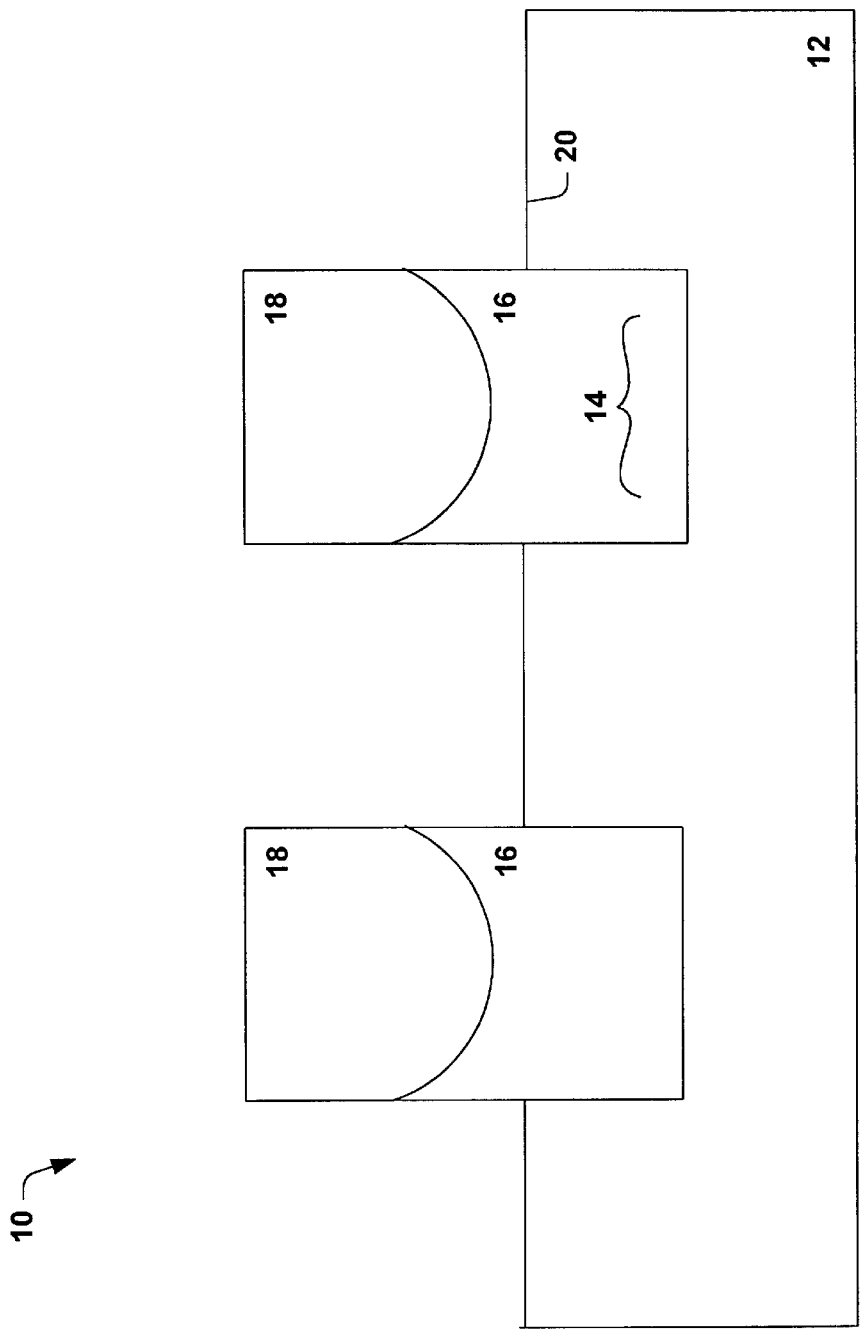
FIG. 2 illustrates a cross-sectional view of another aspect of a conventional trench isolation method.
Figure 3:
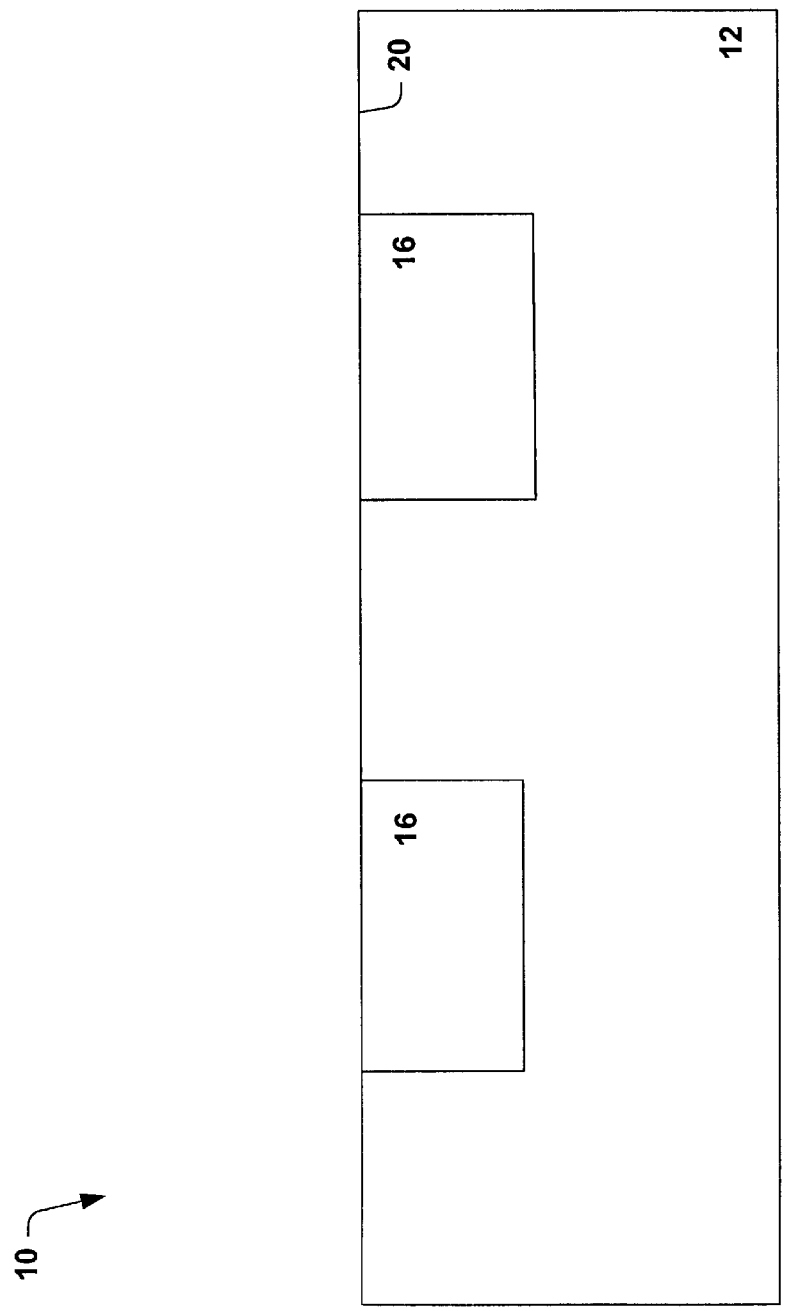
FIG. 3 illustrates a cross-sectional view of yet another aspect of a conventional trench isolation method.
Figure 4:
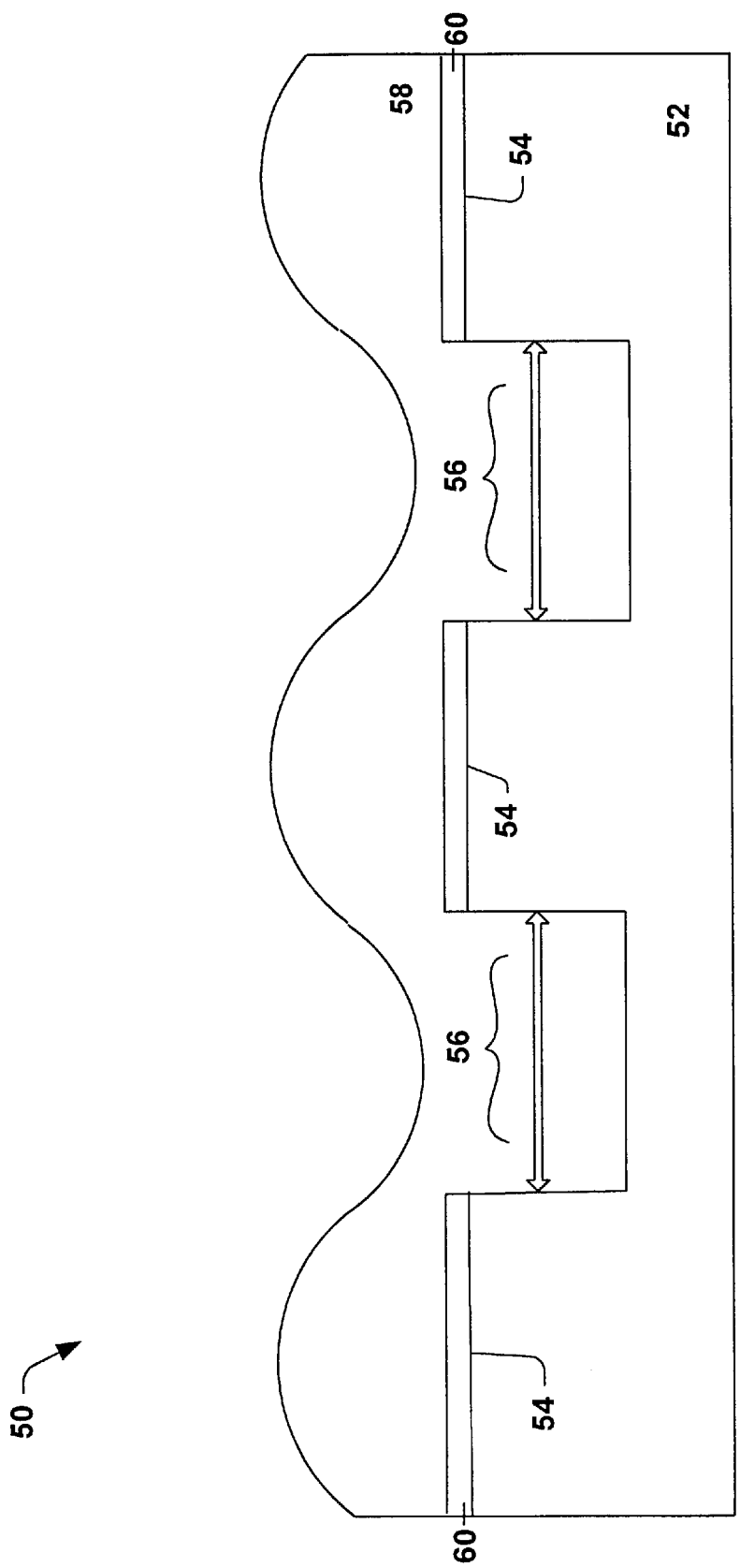
FIG. 4 illustrates a cross-sectional view of a substrate processed in accordance with one aspect of the present invention.

Referring to FIG. 4, a semiconductor structure 50 having semiconductor substrate 52 is provided. Semiconductor substrate 52 may include any suitable semiconductor material, for example, a monocrystalline silicon substrate. Semiconductor substrate 52 includes not only a semiconductor substrate, but may optionally include any and all layers and structures fabricated over the semiconductor substrate up to the point of processing under discussion. Semiconductor substrate 52 includes active regions 54 and trenches 56. Although trenches are shown, vias may alternatively or additionally be formed in semiconductor substrate 52.

The trenches, which are subsequently filled in accordance with the present invention, have a width represented by the arrows. In one embodiment, the width of trenches 56 is from about 0.1 $\mu$m to about 0.6 $\mu$m. In another embodiment, the width of trenches 56 is from about 0.12 $\mu$m to about 0.4 $\mu$m. The trenches may be formed using photolithography techniques, such as patterning a resist over the substrate and removing a portion of the substrate not covered by the resist. The trenches may also be formed by patterning a silicon nitride layer over the substrate, then removing portions of the substrate not covered by the patterned silicon nitride layer.

An insulation material layer 60, such as silicon nitride, is formed over portions of the substrate 52. The insulation material layer 60 may alternatively include one or more of silicon dioxide, silicon oxynitride, boronitride, silicon boronitride and silicon carbide. In another embodiment, semiconductor structure 50 does not include insulation material layer 60. Trench fill material 58 is deposited over the semiconductor structure 50 filling the trenches 56. The trench fill material 58 generally but not closely conforms to the shape of the underlying substrate 52 (semi-conformal). In this connection, the trench fill material 58 layer has a wavy surface with peaks positioned over the active regions 54 and valleys positioned over the trenches 56.

The trench fill material 58 contains a dielectric material. Examples of trench fill materials include silicon containing materials, such as silicon dioxide, fluorine doped silicon glass (FSG), tetraethylorthosilicate (TEOS), phosphosilicate glass (PSG), borophosphosilicate glass (BPSG), any other suitable spin-on glass; high K materials; and low K polymer materials. General examples of low K materials include low K polymers, low K fluorine containing compounds, and low K fluoropolymers. Examples of low K materials include polyimides, fluorinated polyimides, polysilsequioxane, benzocyclobutene (BCB), fluorinated benzocyclobutene, fluorosilicate glass, silicon oxyfluoride, fluorinated polysilicon, polyphenylquinoxaline, copolymers of 2,2-bistrifluoromethyl-4,5-difluoro-1,3-dioxole, perfluoroalkoxy resin, fluorinated ethylene propylene, fluoromethacrylate, poly(arylene ether), parylene F, parylene N, amorphous polytetrafluoroethylene, and low density glass such as low density silicon dioxide. Low density silicon dioxide may be made using sol-gel techniques.

Specific examples of a commercially available low K materials include those under the trade designations Flare™ from AlliedSignal, believed to be derived from perfluorobiphenyl and aromatic bisphenols; Black Diamond™ from Applied Materials; ALCAP-S from Asahi Chemical; SiLK® and Cyclotene® BCB from Dow Chemical; Teflon® polytetrafluoroethylene from DuPont; FOX™, XLK and 3MS from Dow Corning; HSG RZ25 from Hitachi Chemical; HOSP™ and Nanoglass™ from Honeywell Electronic Materials; LKD from JSR Microelectronics; CORAL™ and AF4 from Novellus; mesoporous silica from Battelle PNNL; and Velox™ PAE-2 from Schumacher.

Figure 5:
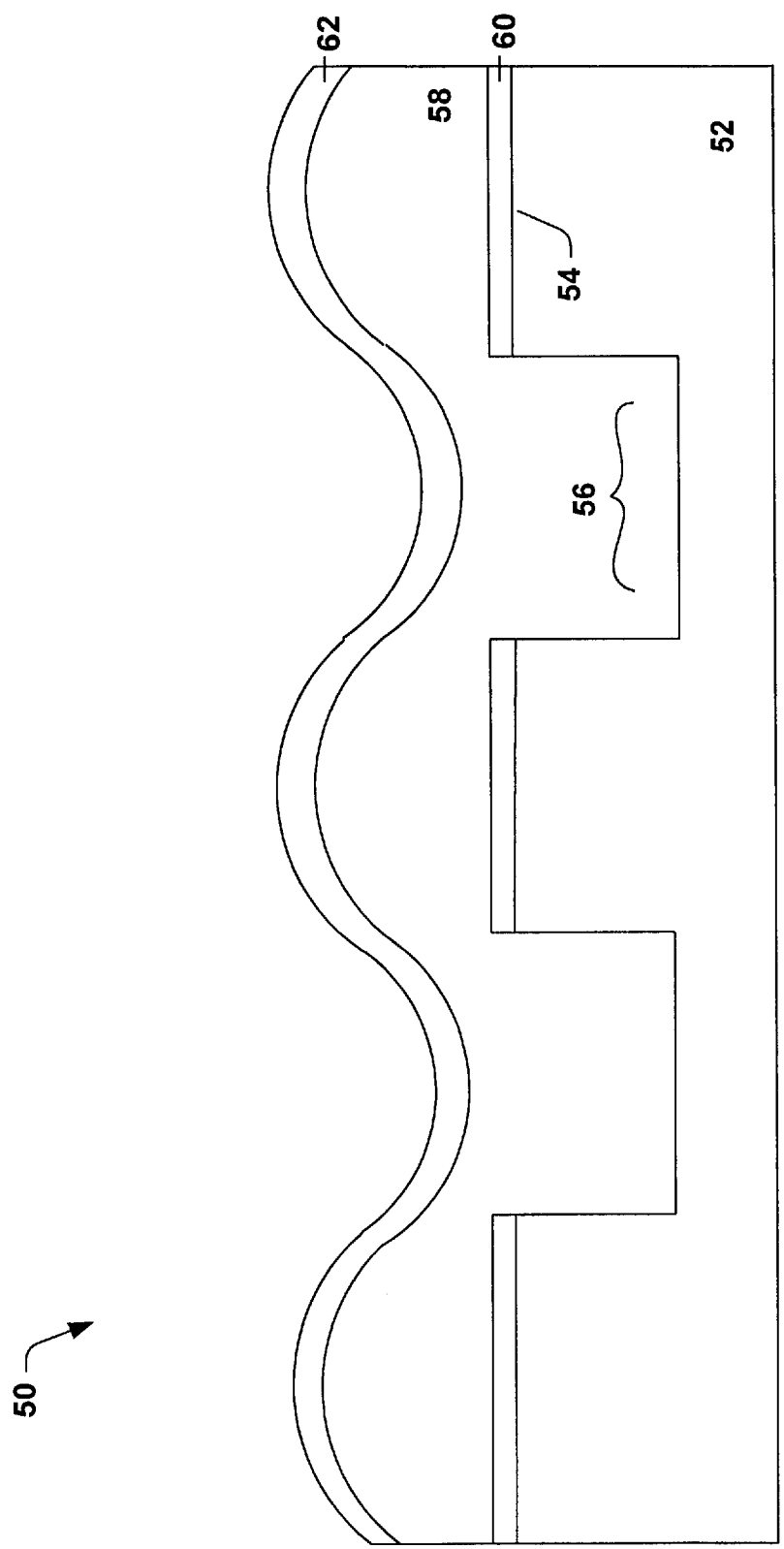
FIG. 5 illustrates a cross-sectional view of a substrate processed in accordance with another aspect of the present invention.

Referring to FIG. 5, an inorganic conformal film 62 is formed over the trench fill material 58 in any suitable manner. The top surface of the inorganic conformal film 62 mimics the top surface of the trench fill material 58 (the inorganic conformal film 62 has peaks positioned over the active regions 54 and valleys positioned over the trenches 56). The inorganic conformal film 62 contains a relatively hard inorganic material, such as materials that may be employed as a hard mask, that has etch selectivity relative to the trench fill material. Examples of inorganic materials include silicon oxynitride, silicon nitride, polysilicon, and metal nitrides. Silicon oxynitride and polysilicon are particularly useful.

In one embodiment, the thickness of the inorganic conformal film 62 is from about 500 Å to about 5,000 Å. In another embodiment, the thickness of the inorganic conformal film 62 is from about 750 Å to about 4,000 Å. In yet another embodiment, the thickness of the inorganic conformal film 62 is from about 1,000 Å to about 3,000 Å.

Figure 6:
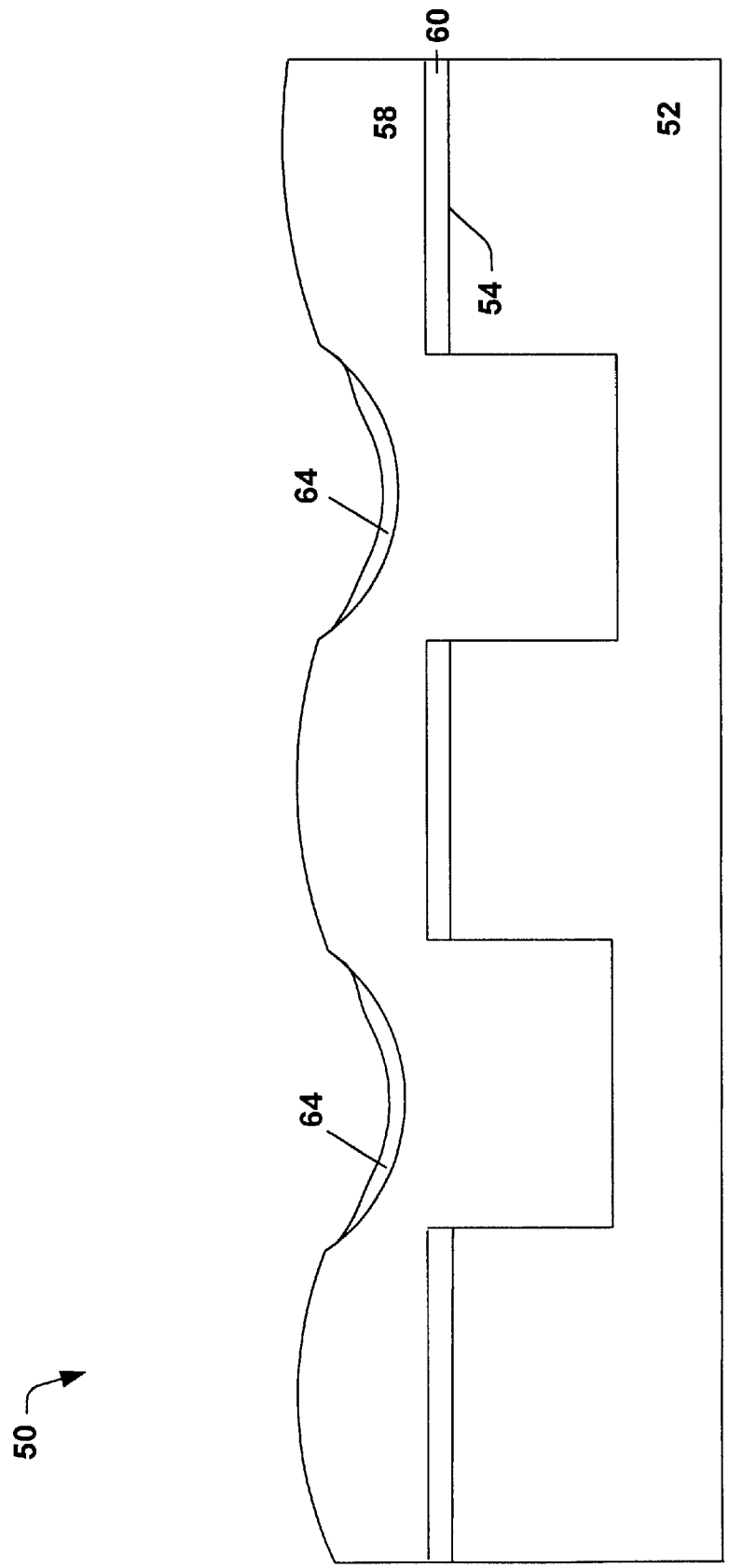
FIG. 6 illustrates a cross-sectional view of a substrate processed in accordance with yet another aspect of the present invention.

Referring to FIG. 6, the semiconductor structure is polished thereby removing portions of the inorganic conformal film 62 and trench fill material 58. In particular, portions of the inorganic conformal film 62 and trench fill material 58 positioned over the active regions 54 are removed since these portions correspond to the peaks. Portions of the inorganic conformal film 62 and trench fill material 58 positioned over the trenches 56 are not removed by the polishing since these portions correspond to the valleys. Polishing is preferably carried out using CMP techniques. Since the portions of the inorganic conformal film 62 positioned over the trenches 56 are not removed by the polishing (since they are in the valleys), the remaining portions of the inorganic conformal film 62 accurately mask the underlying trenches 56.

Figure 7A:
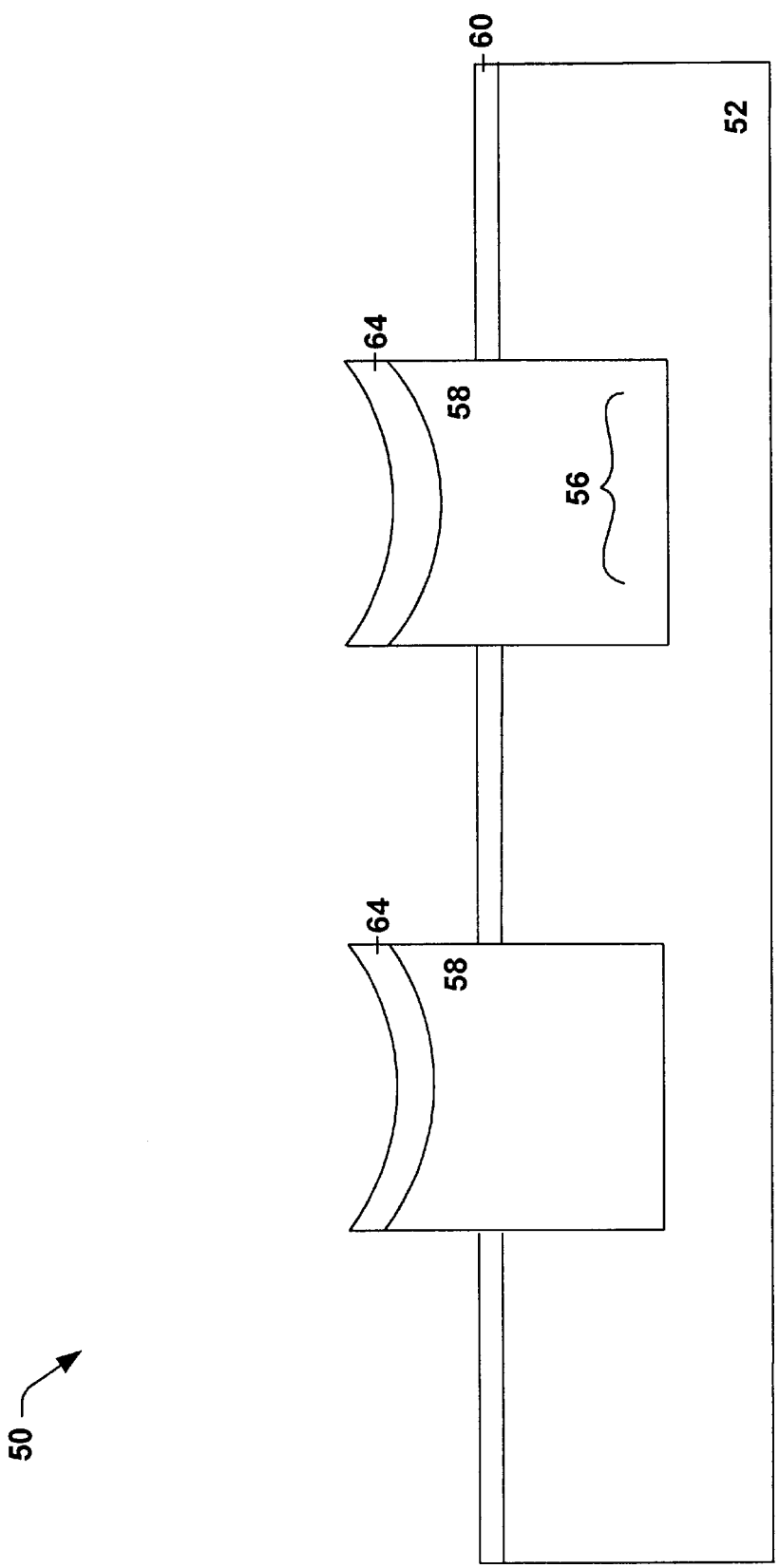
FIG. 7a illustrates a cross-sectional view of a substrate processed in accordance with an alternative aspect of the present invention.
Figure 7B:
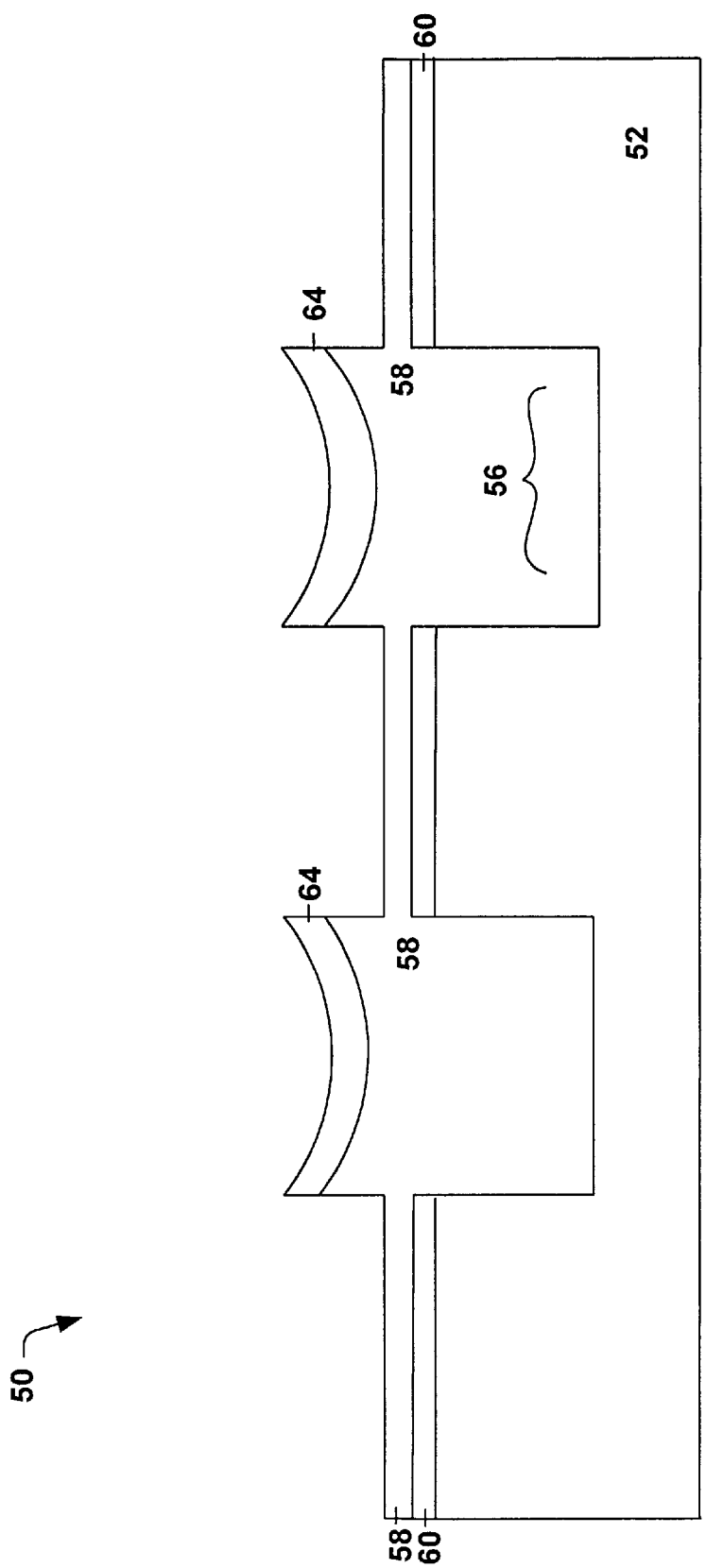
FIG. 7b illustrates a cross-sectional view of a substrate processed in accordance with another alternative aspect of the present invention.

Referring to FIGS. 7a and 7b, two alternative embodiments of using the remaining portions of the inorganic conformal film 62 as a mask for removing portions of the trench fill material 58 not covered by the inorganic conformal film 62. Specifically referring to FIG. 7a, the portions of the trench fill material 58 not covered by the inorganic conformal film 62 are completely removed from semiconductor structure 50 using any suitable technique, such as etching. Isotropic or anisotropic etching is used to remove portions of the trench fill material 58, although anisotropic etching is preferred. For example, an anisotropic plasma etch step may be employed. The etch is selective in that portions of the trench fill material 58 are removed substantially faster than portions of the inorganic conformal film 62. As a result of the etching, the insulation material layer 60 or the active regions 54 of the substrate 52 (in embodiments where the insulation material layer 60 is not employed) are exposed.

Specifically referring to FIG. 7b, the portions of the trench fill material 58 not covered by the inorganic conformal film 62 are substantially but not completely removed from semiconductor structure 50 using any suitable technique, such as etching. Isotropic or anisotropic etching is used to remove portions of the trench fill material 58, although anisotropic etching is preferred. A thin layer of the trench fill material 58 remains over the active regions 54 of the substrate 52. In a subsequently described planarizing step, the presence of the remaining thin trench fill material 58 over the active regions 54 contributes to the ability of the planarizing step to accurately planarize the semiconductor structure 50.

Figure 8:
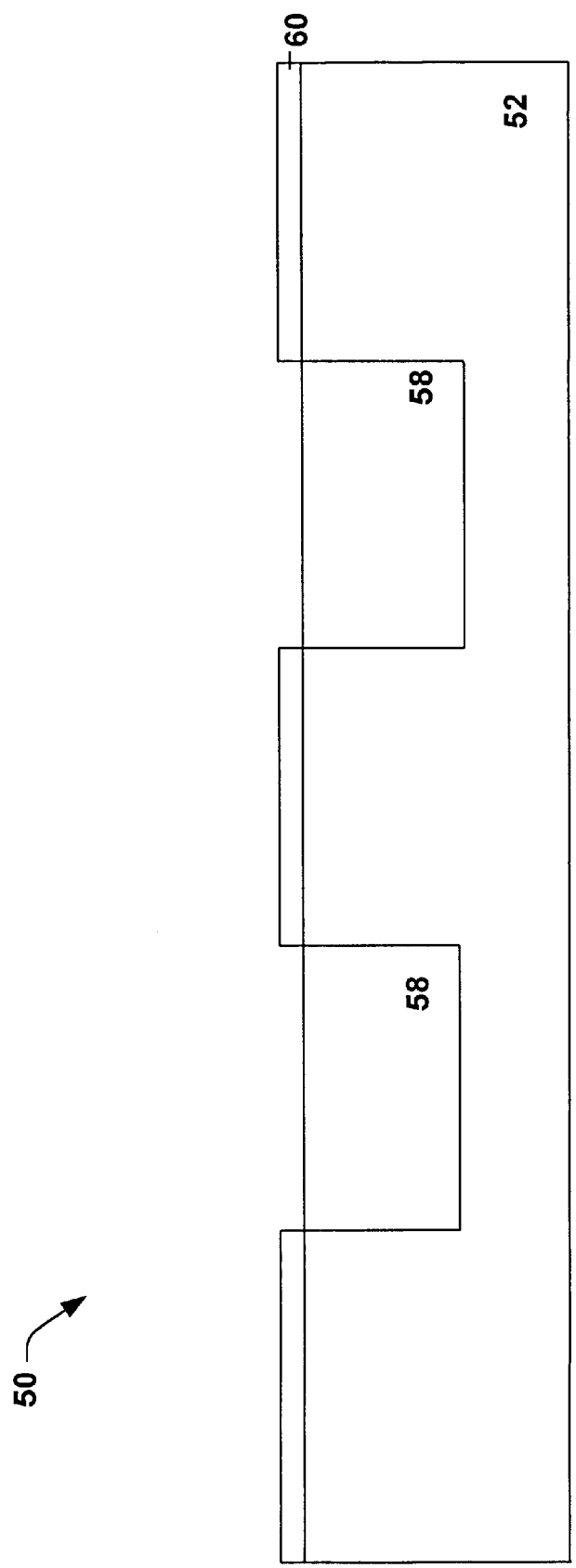
FIG. 8 illustrates a cross-sectional view of a substrate processed in accordance with yet another aspect of the present invention.

Referring to FIG. 8, portions of the trench fill material 58 above the top surface of the substrate 52 and the remaining portions of the inorganic conformal film 62 are removed in any suitable manner thereby planarizing or substantially planarizing the semiconductor structure 50. The semiconductor structure 50 is substantially planarized using etching or polishing techniques. Etching typically involves using a dilute acid solution or one or more plasma gases. Selection of a particular etchant primarily depends upon the particular material employed for the trench fill material and the inorganic conformal film. Isotropic or anisotropic etching is used, although isotropic etching is preferred.

Referring to FIG. 9, if present, the insulation material layer 60 is stripped from semiconductor structure 50 using any suitable technique, such as an acid solution rinse. Plasma stripping may alternatively be employed. If the insulation material layer 60 is not present, the semiconductor structure 50 may be cleaned using suitable cleaning techniques. Semiconductor structure 50 may then proceed to further processing, such as forming conductive structures and electrical devices in the active regions of the substrate 52.

The semiconductor structure 50 produced in accordance with the present invention, as shown in FIG. 9, has trench isolation regions that are completely filled with a dielectric material. Since the valleys of the trench fill material deposited over the semiconductor structure correspond to the trenches in the substrate, the remaining portions of the inorganic conformal film after polishing also accurately correspond to the trenches in the substrate. The trench fill process is thus accurate, and it does not depend upon using a photoresist. The concerns associated with using a photoresist are therefore eliminated. The present invention may be applied to making shallow trench isolation regions, LOCOS, and recessed oxide isolation regions.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming trench isolation regions within a semiconductor substrate, comprising:

forming trenches in the semiconductor substrate;

depositing a semi-conformal dielectric material over the substrate, wherein the semi-conformal dielectric material has valleys positioned over the trenches;

forming an inorganic conformal film over the semi-conformal dielectric material with the proviso that a photoresist is not deposited over the inorganic conformal film and the semi-conformal dielectric material;

polishing the semiconductor substrate whereby a first portion of the inorganic conformal film is removed thereby exposing a portion of the semi-conformal dielectric material, and a second portion remains over the valleys of the semi-conformal dielectric material;

removing the exposed portions of the semi-conformal dielectric material; and planarizing the substrate to provide the semiconductor substrate having trenches with a dielectric material therein.

2. The method according to claim 1, wherein the semi-conformal dielectric material comprises at least one of fluorine doped silicon glass, tetraethylorthosilicate, phosphosilicate glass, borophosphosilicate glass, high K materials, and low K polymer materials.

3. The method according to claim 1, wherein the inorganic conformal film comprises at least one of silicon oxynitride, silicon nitride, polysilicon, and metal nitrides.

4. The method according to claim 1, wherein the inorganic conformal film has a thickness from about 500 Å to about 5,000 Å.

5. The method according to claim 1, wherein polishing involves chemical mechanic polishing.

6. The method according to claim 1, wherein the exposed portions of the semi-conformal dielectric material are removed by anisotropic etching.

7. The method according to claim 1, wherein the substrate is planarized by one of etching and polishing.

8. A method of forming trench isolation regions within a semiconductor substrate, comprising:

providing the semiconductor substrate having trenches therein and active regions;

depositing a semi-conformal dielectric material over the substrate, wherein the semi-conformal dielectric material has valleys positioned over the trenches and peaks positioned over the active regions;

forming an inorganic conformal film over the semi-conformal dielectric material with the proviso that a photoresist is not deposited over the inorganic conformal film and the semi-conformal dielectric material;

polishing the semiconductor substrate whereby portions of the inorganic conformal film over the active regions are removed thereby exposing a portion of the semi-conformal dielectric material, and portions of the inorganic conformal film over the valleys of the semi-conformal dielectric material remain;

removing the exposed portions of the semi-conformal dielectric material; and planarizing the substrate to provide the semiconductor substrate having trenches with a dielectric material therein.

9. The method according to claim 8, wherein the semi-conformal dielectric material comprises at least one of fluorine doped silicon glass, tetraethylorthosilicate, phosphosilicate glass, and borophosphosilicate glass.

10. The method according to claim 8, wherein the semi-conformal dielectric material comprises at least one of polyimides, fluorinated polyimides, polysilsequioxane, benzocyclobutene, fluorinated benzocyclobutene, fluorinated polysilicon, polyphenylquinoxaline, copolymers of 2,2-bistrifluoromethyl-4,5-difluoro-1,3-dioxole, perfluoroalkoxy resin, fluorinated ethylene propylene, fluoromethacrylate, poly(arylene ether), parylene F, parylene N, and amorphous polytetrafluoroethylene.

11. The method according to claim 8, wherein the inorganic conformal film comprises at least one of silicon oxynitride, silicon nitride, polysilicon, and metal nitrides.

12. The method according to claim 8, wherein the inorganic conformal film has a thickness from about 750 Å to about 4,000 Å.

13. The method according to claim 8, wherein the exposed portions of the semi-conformal dielectric material are removed by anisotropic etching using a plasma.

14. The method according to claim 8, wherein the substrate is planarized by etching with a dilute acid solution.

15. A method of forming shallow trench isolation regions within a semiconductor substrate, comprising:

providing the semiconductor substrate having trenches therein and silicon nitride covered active regions;

depositing a semi-conformal dielectric material over the substrate, wherein the semi-conformal dielectric material has valleys positioned over the trenches and peaks positioned over the silicon nitride;

forming an inorganic conformal film over the semi-conformal dielectric material with the proviso that a photoresist is not deposited over the inorganic conformal film and the semi-conformal dielectric material;

chemical mechanical polishing the semiconductor substrate whereby portions of the inorganic conformal film over the silicon nitride are removed thereby exposing a portion of the semi-conformal dielectric material, and portions of the inorganic conformal film over the valleys of the semi-conformal dielectric material remain;

removing the exposed portions of the semi-conformal dielectric material;

planarizing the substrate; and stripping the silicon nitride from the substrate to provide the semiconductor substrate having trenches with a dielectric material therein.

16. The method according to claim 15, wherein the semi-conformal dielectric material comprises at least one of fluorine doped silicon glass, tetraethylorthosilicate, phosphosilicate glass, and borophosphosilicate glass.

17. The method according to claim 15, wherein the semi-conformal dielectric material comprises a low K dielectric material.

18. The method according to claim 15, wherein the inorganic conformal film comprises at least one of silicon oxynitride and polysilicon.

19. The method according to claim 15, wherein the inorganic conformal film has a thickness from about 500 Å to about 5,000 Å.

20. The method according to claim 15, wherein the inorganic conformal film has a thickness from about 1,000 Å to about 3,000 Å.

* * * * *